US012750016B2

(12) United States Patent
Chen

(10) Patent No.: US 12,750,016 B2
(45) Date of Patent: Sep. 29, 2026

(54) METHOD FOR ADAPTIVELY ADJUSTING START-UP TIME OF AUDIO AMPLIFIER AND ASSOCIATED SYSTEM ON CHIP

(71) Applicant: Elite Semiconductor Microelectronics Technology Inc., Hsinchu (TW)

(72) Inventor: Isaac Y. Chen, Hsinchu (TW)

(73) Assignee: Elite Semiconductor Microelectronics Technology Inc., Hsinchu (TW)

( * ) Notice: Subject to any disclaimer, the term of this patent is extended or adjusted under 35 U.S.C. 154(b) by 189 days.

(21) Appl. No.: 18/939,464

(22) Filed: Nov. 6, 2024

(65) Prior Publication Data

US 2026/0128719 A1 May 7, 2026

(51) Int. Cl.
*H03F 3/183* (2006.01)

(52) U.S. Cl.
CPC ......... *H03F 3/183* (2013.01); *H03F 2200/03* (2013.01)

(58) Field of Classification Search
CPC . H03F 3/68; H03F 3/187; H03F 3/183; H03F 2200/03; H03G 3/34; H03G 3/348; H03G 5/00; H03G 5/025; H04R 3/007
USPC .................................. 381/94.5, 28, 104, 120
See application file for complete search history.

(56) References Cited

U.S. PATENT DOCUMENTS

| | | | | |
|---|---|---|---|---|
| 4,788,508 | A | 11/1988 | Kawai | |
| 7,760,016 | B2 * | 7/2010 | Kanji | H03F 1/305 330/149 |
| 2009/0196435 | A1 * | 8/2009 | Miao | H03F 3/45475 381/94.5 |

FOREIGN PATENT DOCUMENTS

| | | | | |
|---|---|---|---|---|
| CN | 111293988 | A | 6/2020 | |
| TW | 201717539 | A | 5/2017 | |
| WO | WO-2009025665 | A1 * | 2/2009 | H03F 1/305 |
| WO | WO-2009099904 | A2 * | 8/2009 | H03F 1/305 |

OTHER PUBLICATIONS

Wang Haishi et al., "Ways to suppress click and pop for class D amplifiers", Journal of Semiconductors, vol. 33, No. 8, 2012 Chinese Institute of Electronics, pp. 085005-1~085005-5, https://iopscience.iop.org/article/10.1088/1674-4926/33/8/085005/pdf, 2012.

* cited by examiner

*Primary Examiner* — William A Jerez Lora
(74) *Attorney, Agent, or Firm* — Winston Hsu

(57) ABSTRACT

An audio amplifier chip includes an audio amplifier, a current providing circuit, a detection circuit, and a control circuit. The audio amplifier is arranged to drive a speaker, wherein the audio amplifier has multiple differential input terminals, and a direct current (DC) blocking capacitor is coupled to one of the multiple differential input terminals. The current providing circuit is arranged to provide at least one current for charging the DC blocking capacitor. The detection circuit is coupled to a node located between the one of the multiple differential input terminals and the DC blocking capacitor, and is arranged to detect whether an external resistor of the audio amplifier chip exists according to an input voltage from the node, in order to generate a detection result. The control circuit is arranged to determine a start-up time of the audio amplifier according to the detection result.

22 Claims, 5 Drawing Sheets

METHOD FOR ADAPTIVELY ADJUSTING START-UP TIME OF AUDIO AMPLIFIER AND ASSOCIATED SYSTEM ON CHIP

BACKGROUND OF THE INVENTION

1. Field of the Invention

The present invention is related to an audio amplifier, and more particularly, to an audio amplifier chip that can adaptively adjust a start-up time of the audio amplifier, and an associated method.

2. Description of the Prior Art

An audio amplifier may receive differential audio inputs through direct current (DC) blocking capacitors and charge the DC blocking capacitors in a charging mode. When there is a need for fast charging, if an external resistor coupled between the DC blocking capacitor and the audio amplifier exists for adjusting the gain of the audio amplifier, resistor-capacitor (RC) time constants between differential input terminals of the audio amplifier may be different and/or a voltage difference between the differential input terminals may be large, which may cause POP problems (i.e., pop noise). As a result, a start-up time of the audio amplifier is usually delayed. Some existing audio amplifiers, however, require a faster start-up time (e.g., audio amplifiers that drive Artificial Intelligence (AI) speakers), and delaying the start-up time for these audio amplifiers may cause further problems. As a result, a novel audio amplifier chip that can detect whether an external resistor exists and thereby adjust a start-up time of an audio amplifier is urgently needed.

SUMMARY OF THE INVENTION

It is therefore one of the objectives of the present invention to provide an audio amplifier chip that can adaptively adjust a start-up time of an audio amplifier, and an associated method, in order to address the above-mentioned issues.

According to an embodiment of the present invention, an audio amplifier chip is provided. The audio amplifier chip comprises an audio amplifier, a current providing circuit, a detection circuit, and a control circuit. The audio amplifier is arranged to drive a speaker, wherein the audio amplifier has multiple differential input terminals, and a DC blocking capacitor is coupled to one of the multiple differential input terminals. The current providing circuit is arranged to provide at least one current for charging the DC blocking capacitor. The detection circuit is coupled to a node located between the one of the multiple differential input terminals and the DC blocking capacitor, and is arranged to detect whether an external resistor of the audio amplifier chip exists according to an input voltage from the node, in order to generate a detection result. The control circuit is arranged to determine a start-up time of the audio amplifier according to the detection result.

According to an embodiment of the present invention, a method for adaptively adjusting a start-up time of an audio amplifier is provided, wherein a speaker is driven by the audio amplifier, and the audio amplifier is comprised in an audio amplifier chip. The method comprises: charging a DC block capacitor by at least one current, wherein the DC block capacitor is coupled to one of multiple differential input terminals of the audio amplifier; detecting whether an external resistor of the audio amplifier chip exists according to an input voltage from a node, in order to generate a detection result, wherein the node is located between the one of the multiple differential input terminals and the DC blocking capacitor; and determining the start-up time of the audio amplifier according to the detection result.

One of the benefits of the present invention is that, by the method and an associated audio amplifier chip proposed by the present invention, a start-up time of an audio amplifier can be adaptively adjusted according to different scenarios (e.g., existence of external resistors of the audio amplifier chip). In this way, an optimized balance between the start-up time and the POP problems (i.e., pop noise) can be achieved, and the audio amplifier chip of the present invention can be applied to different types of speakers (e.g., speakers with/without the external resistors). In addition, the method and the audio amplifier chip of the present invention can further detect whether an external system on chip (SoC) driver is ready to drive the audio amplifier chip, and the audio amplifier chip is prevented from being started until the external SoC driver is ready. In this way, the potential POP problems may be further avoided.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
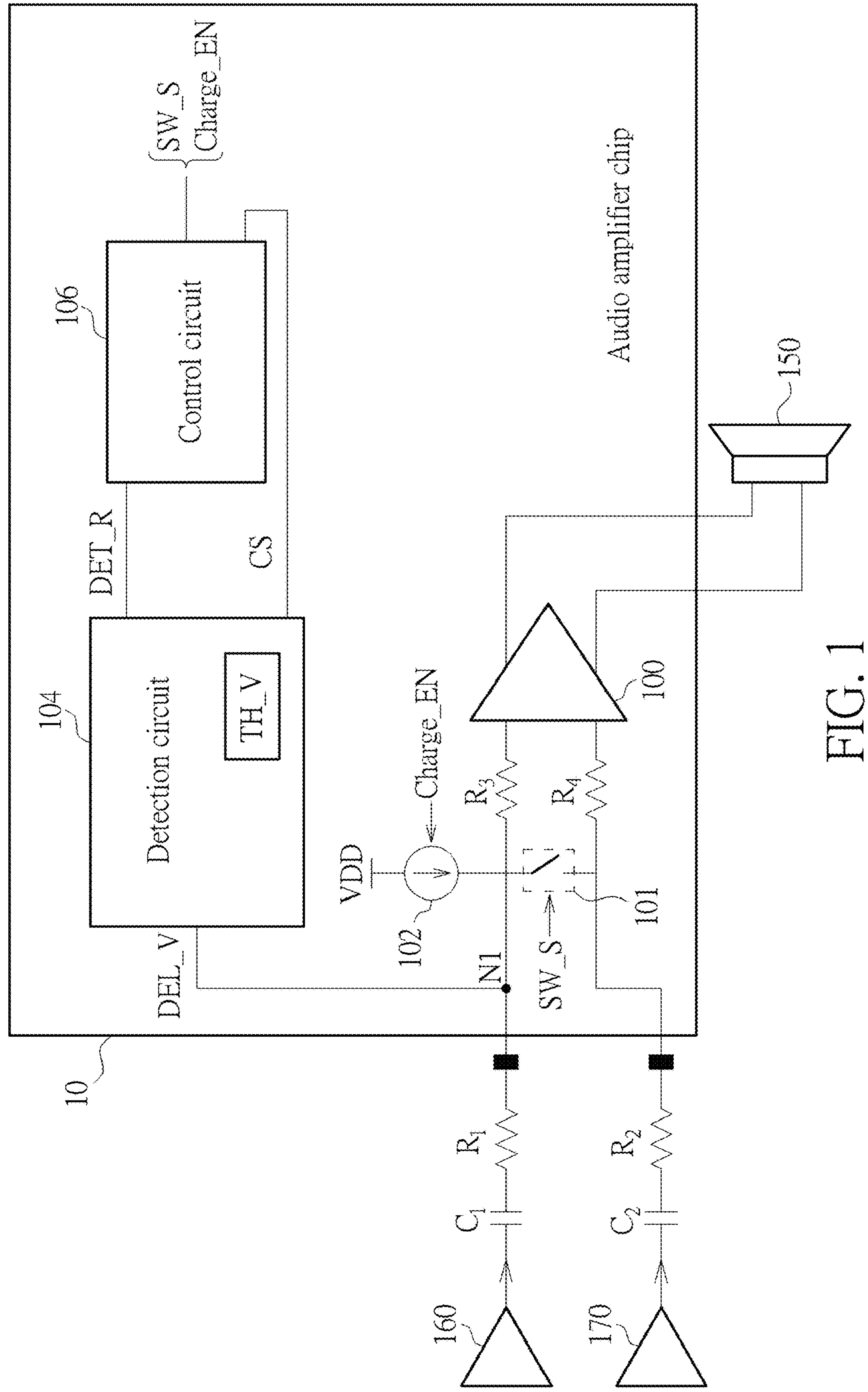
FIG. 1 is a block diagram of an audio amplifier chip according to an embodiment of the present invention.

FIG. 1 is a block diagram of an audio amplifier chip 10 according to an embodiment of the present invention. As shown in FIG. 1, the audio amplifier chip 10 may include an audio amplifier 100, a switching circuit 101, a current providing circuit 102, a detection circuit 104, a control circuit 106, and multiple resistors $R_3$ and $R_4$. The audio amplifier 100 may be arranged to drive a speaker 150, and has multiple differential input terminals, wherein the differential input terminals may receive differential audio inputs via the direct current (DC) blocking capacitors $C_1$ and $C_2$, respectively. The resistor $R_3$ has a first terminal and a second terminal, where the first terminal is coupled to one of the differential input terminals of the audio amplifier 100. The resistor $R_4$ has a first terminal and a second terminal, where the first terminal is coupled to another of the differential input terminals of the audio amplifier 100. The switching circuit 101 may be coupled between the second terminal of the resistor $R_3$ and the second terminal of the resistor $R_4$. That is, the switching circuit 101 may be coupled between the differential input terminals of the audio amplifier 100.

The current providing circuit 102 may be a current source for providing at least one current (e.g., multiple currents with different current values), and may be coupled between a supply voltage VDD and the second terminal of the resistor $R_3$, wherein the multiple currents may be arranged to charge the DC blocking capacitors $C_1$ and $C_2$. For example, the multiple currents may include a current $I_{trickle}$ for detecting whether external system on chip (SoC) drivers (e.g., SoC drivers 160 and 170) are ready to drive the audio amplifier chip 10, and a current $I_{QC}$ for detecting whether external resistors of the audio amplifier chip 10 (e.g., resistors $R_1$ and $R_2$) exist, wherein a current value of the current $I_{trickle}$ is smaller than that of the current $I_{QC}$.

The detection circuit 104 may be coupled to a node located between one of the multiple differential input terminals of the audio amplifier 100 and a corresponding DC blocking capacitor. In this embodiment, the detection circuit 104 may be coupled to a node N1 located between the upper differential input terminal of the audio amplifier 100 and the DC blocking capacitor $C_1$, but the present invention is not limited thereto. In some embodiments, the detection circuit 104 may be instead coupled to a node located between the lower differential input terminal of the audio amplifier 100 and the DC blocking capacitor $C_2$.

Figure 2:
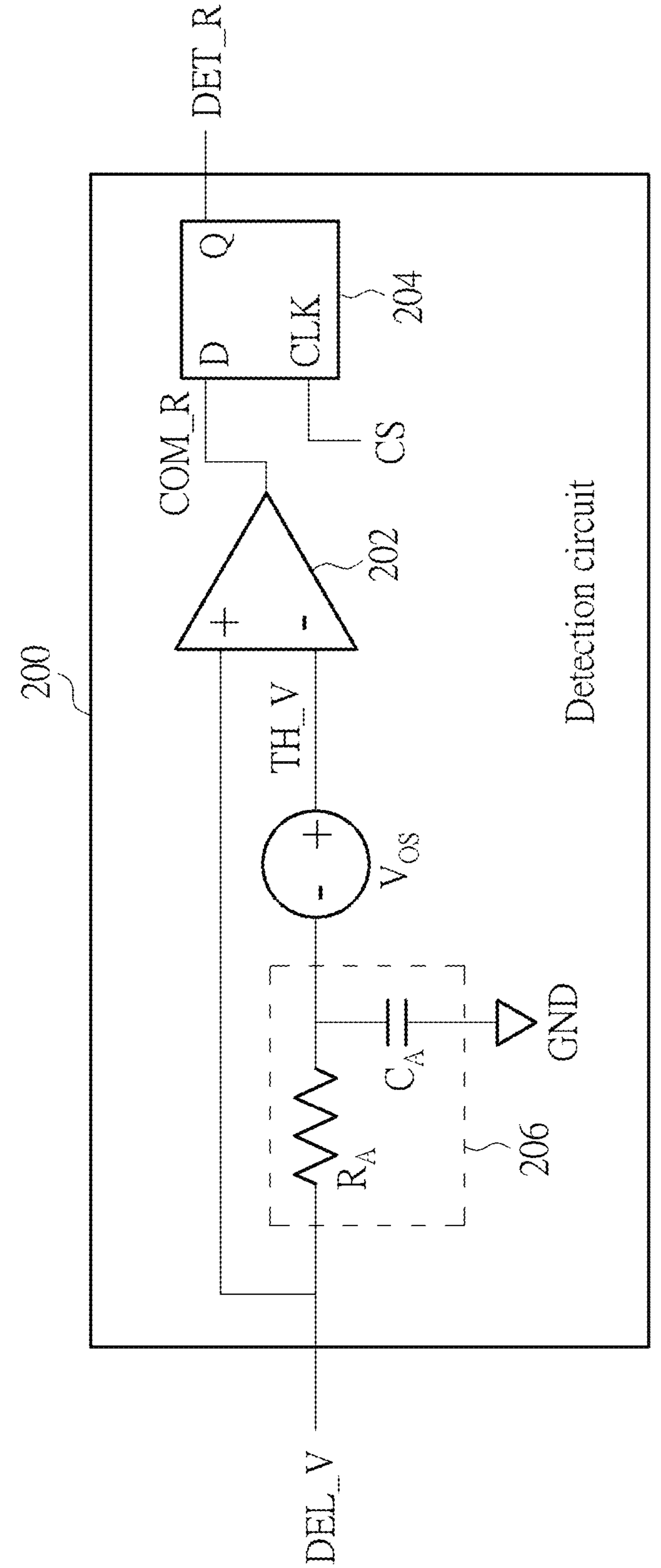
FIG. 2 is a diagram illustrating a detection circuit according to an embodiment of the present invention.

In order to detect whether an external resistor of the audio amplifier chip 10 (e.g., the resistor $R_1$) exists, after the DC blocking capacitor $C_1$ is charged by the current $I_{QC}$, the detection circuit 104 may be arranged to receive an input voltage DEL_V from the node N1, and compare the input voltage DEL_V with a threshold voltage TH_V in order to generate a detection result DET_R, wherein the input voltage DEL_V may be a voltage difference caused by the resistor $R_1$ and the current $I_{QC}$ (e.g., $DEL\_V=I_{QC}*R_1$). In detail, refer to FIG. 2. FIG. 2 is a diagram illustrating a detection circuit 200 according to an embodiment of the present invention, wherein the detection circuit 104 shown in FIG. 1 may be implemented by the detection circuit 200. As shown in FIG. 2, the detection circuit 200 may include at least one comparator circuit (e.g., a comparator circuit 202), at least one D-type latch (D-latch) circuit (e.g., a D-latch circuit 204, at least one resistor-capacitor (RC) constant circuit (e.g., an RC constant circuit 206), and a voltage source $V_{OS}$.

The comparator circuit 202 has a positive input terminal (label as "+" in FIG. 2) receiving the input voltage DEL_V from the node N1, a negative input terminal (label as "−" in FIG. 2) receiving the threshold voltage TH_V, and an output terminal, and may be arranged to perform a comparison operation upon the input voltage DEL_V and the threshold voltage TH_V, in order to generate a comparison result COM_R, wherein the comparison result COM_R is output from the output terminal, and the detection result DET_R depends on the comparison result COM_R. In this embodiment, the threshold voltage TH_V may be set by the RC constant circuit 206 and the voltage source $V_{OS}$, wherein the RC constant circuit 206 includes a resistor $R_A$ and a capacitor $C_A$, the resistor $R_A$ has a first terminal coupled to the positive input terminal of the comparator circuit 202 and a second terminal; and the capacitor $C_A$ has a first terminal coupled to the second terminal of the resistor $R_A$, and a second terminal coupled to a grounding voltage GND. For example, the RC constant circuit 206 may be arranged to receive the input voltage DEL_V, and extract a previous input voltage according to the input voltage DEL_V, for acting as the threshold voltage TH_V. In response to the comparison result COM_R indicating that the input voltage DEL_V is greater than the threshold voltage TH_V (i.e., COM_R>DEL_V), the detection result DET_R indicates that the external resistor (e.g., the resistor $R_1$) exists. In other words, in response to the comparison result COM_R indicating that the input voltage DEL_V is not greater than the threshold voltage TH_V (i.e., COM_R≤DEL_V), the detection result DET_R indicates that the external resistor (e.g., the resistor $R_1$) does not exist.

In addition, under a condition that the external resistor exists, after the DC blocking capacitor $C_1$ is charged, the input voltage DEL_V may gradually become smaller over time. If the input voltage DEL_V is detected too late, the detection result DEL_V will be inaccurate. In order to address this issue, the detection circuit 200 may be arranged to detect the input voltage DEL_V within a detection time window, and latch the detection result DET_R via the D-latch circuit 204. For example, the D-latch circuit 204 has an input terminal (label as "D" in FIG. 2), a clock terminal label as "CLK" in FIG. 2, and an output terminal (label as "Q" in FIG. 2), wherein the input terminal receives the comparison result COM_R, the clock terminal receives a control signal CS from the control circuit 106, and the detection result DET_R is output at the output terminal.

Refer back to FIG. 1. The control circuit 106 may be arranged to determine a start-up time of the audio amplifier 100 according to the detection result DET_R. For example, in response to the detection result DET_R indicating that the external resistor exists, the control circuit 106 may determine a larger start-up time for the audio amplifier 100. In response to the detection result DET_R indicating that the external resistor does not exist, the control circuit 106 may determine a smaller start-up time for the audio amplifier 100. In addition, the control circuit 106 may be further arranged to generate a switching control signal SW_S and an enabling signal Charge_EN according to the determined start-up time, for controlling switching of the switching circuit 101 and enabling the current providing circuit 102, respectively, in order to control the start-up time of the audio amplifier 100 as the determined start-up time. Furthermore, the control circuit 106 may generate the control signal CS for acting as a clock signal of the D-latch circuit 204 shown in FIG. 2.

Figure 3:
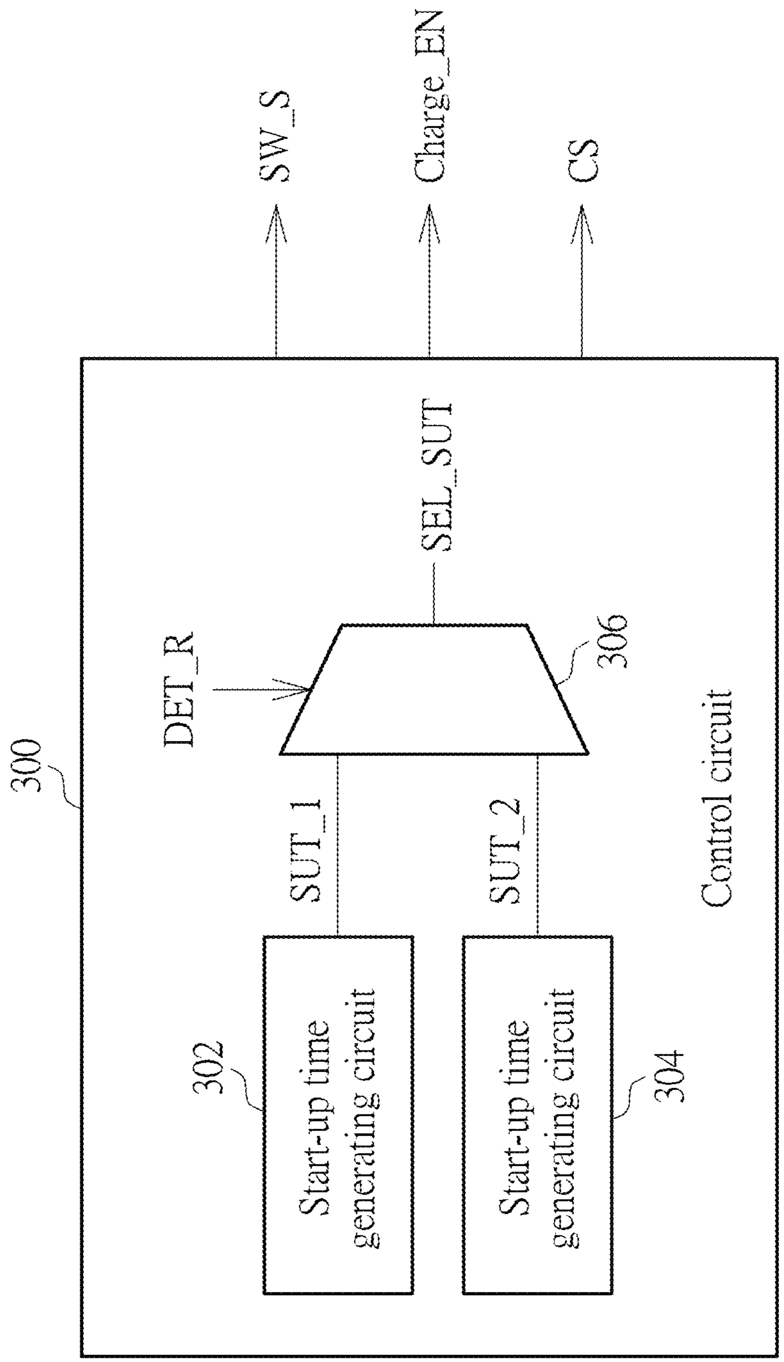
FIG. 3 is a diagram illustrating a control circuit according to an embodiment of the present invention.

FIG. 3 is a diagram illustrating a control circuit 300 according to an embodiment of the present invention, wherein the control circuit 106 shown in FIG. 1 may be implemented by the control circuit 300. As shown in FIG. 3, the control circuit 300 may include multiple start-up time generating circuits 302 and 304, and a multiplexer (MUX) circuit 306. The start-up time generating circuits 302 and 304 may be arranged to generate different start-up times SUT_1 and SUT_2, respectively. It is assumed that the start-up time SUT_1 is greater than the start-up time SUT_2.

The MUX circuit 306 may be arranged to receive the start-up times SUT_1 and SUT_2 from the start-up time generating circuits 302 and 304, receive the detection result DET_R from the detection circuit 104 as a selection signal, and perform a selection operation upon the start-up times SUT_1 and SUT_2 according to the selection signal, in order to generate a selected start-up time SEL_SUT for acting as the start-up time of the audio amplifier 100. For example, in response to the detection result DET_R indicating that the external resistor exists, the MUX circuit 306 may select the start-up time SUT_1 as the selected start-up time SEL_SUT. In response to the detection result DET_R indicating that the external resistor does not exist, the MUX circuit 306 may select the start-up time SUT_2 as the selected start-up time SEL_SUT. However, this is for illustrative purposes only, and is not meant to be a limitation of the present invention. The control circuit 300 may have more than two start-up time generating circuits, depending upon actual design considerations. For example, the control circuit 300 may set more than two start-up times via the start-up time generating circuits according to the resistance value of the external resistor.

When the DC blocking capacitors $C_1$ and $C_2$ are charged, the SoC drivers 160 and 170 may not yet be ready to drive the audio amplifier chip 10 (e.g., the audio amplifier chip 10 is powered on, but the SoC drivers 160 and 170 are not yet powered on). Under this situation, the DC blocking capacitors $C_1$ and $C_2$ may be floating. Assume that the driving capability of each SoC driver can be equivalent to small output impedance (e.g., 1k ohm). When the DC blocking capacitors $C_1$ and $C_2$ are floating, it may cause considerable output impedance (e.g., 100k ohm) and potential POP problems (i.e., pop noise) when the speaker 150 is started. In order to address this issue, the current providing circuit 102 may provide the current $I_{trickle}$ for detecting whether the external SoC drivers (e.g., the SoC drivers 160 and 170) are ready to drive the audio amplifier chip 10.

Figure 4:
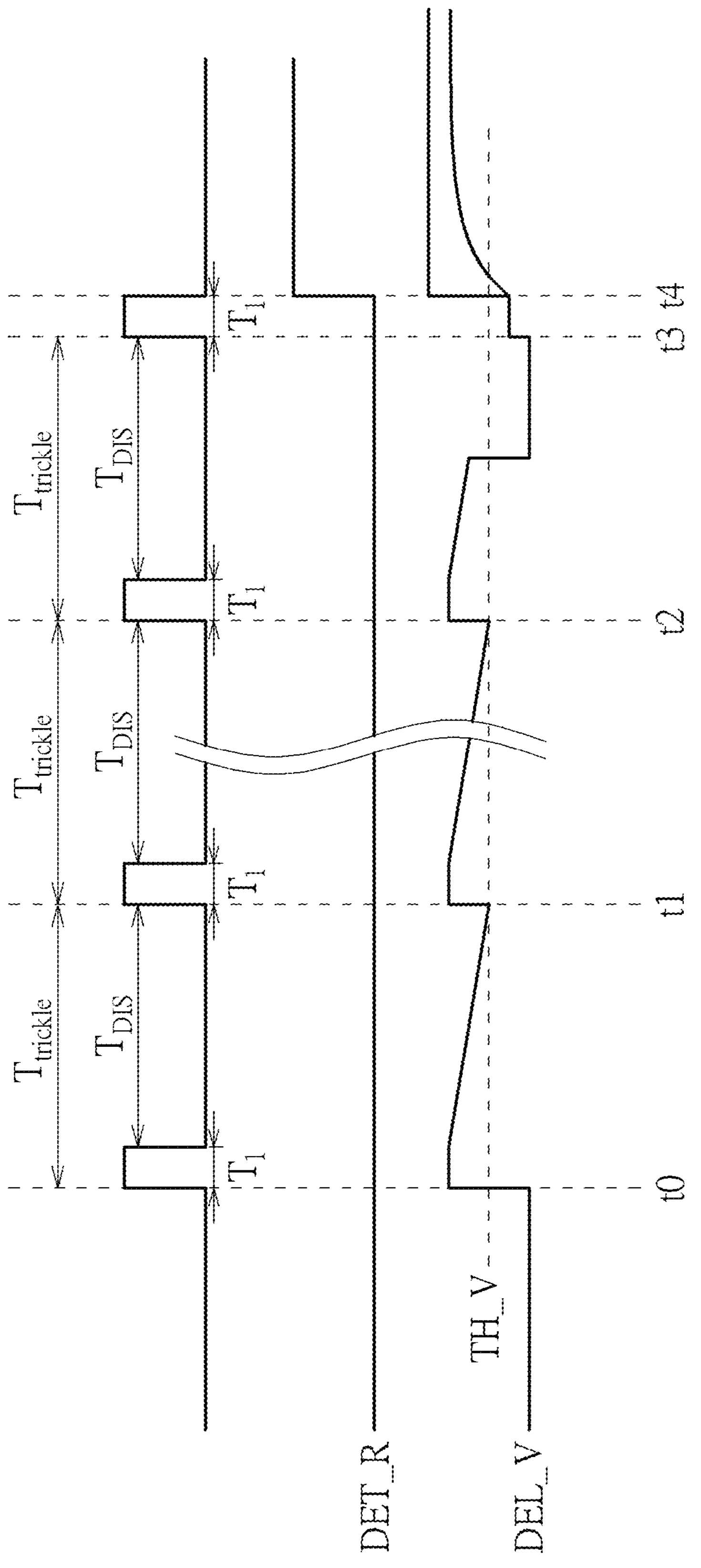
FIG. 4 is a timing diagram illustrating voltage variation of an input voltage and a detection result according to an embodiment of the present invention.

Specifically, refer to FIG. 4. FIG. 4 is a timing diagram illustrating voltage variation of the input voltage DEL_V and the detection result DET_R according to an embodiment of the present invention. The current providing circuit 102 may charge the DC blocking capacitor $C_1$ (or the DC blocking capacitor $C_2$) with the current $I_{trickle}$ every time period $T_{trickle}$, in order to detect whether the SoC driver 160 (or the SoC driver 170) is ready to drive the audio amplifier chip 10. Only after the detection result DET_R indicates that the SoC driver 160 is ready to drive the audio amplifier chip 10, the current providing circuit 102 provides the current $I_{QC}$ for charging the DC blocking capacitor $C_1$, and the detection circuit 104 starts to detect whether the resistor $R_1$ exists according to the input voltage DEL_V.

As shown in FIG. 4, at a time point t0, the current providing circuit 102 may provide the current $I_{trickle}$ for charging the DC blocking capacitor $C_1$, and the detection circuit 104 may detect whether the SoC driver 160 is ready to drive the audio amplifier chip 10 according to the input voltage DEL_V within a time interval $T_1$, in order to generate the detection result DET_R. More particularly, the comparator circuit within the detection circuit 104 may perform a comparison operation upon the input voltage DEL_V and the above-mentioned threshold voltage TH_V, in order to generate a comparison result COM_R2, wherein the detection result DET_R depends on the comparison result COM_R2.

After the DC blocking capacitor $C_1$ is charged by the current $I_{trickle}$ at the time point t1, in response to the comparison result COM_R2 indicating that the input voltage DEL_V being greater than the threshold voltage TH_V within the time interval $T_1$, the detection result DET_R indicates that the SoC driver 160 is not ready to drive the audio amplifier chip 10, and the audio amplifier chip 10 is prevented from being started. Under this situation, the DC blocking capacitor $C_1$ may be started to be discharged during a time period $T_{DIS}$ (e.g., $T_{DIS}=T_{trickle}-T_1$), and then the current providing circuit 102 may provide the current $I_{trickle}$ again for charging the DC blocking capacitor $C_1$, until the SoC driver 160 is ready to drive the audio amplifier chip 10.

At time points t1 and t2, the comparison result COM_R2 still indicates that the input voltage DEL_V being greater than the threshold voltage TH_V within the time interval $T_1$, the detection result DET_R indicates that the SoC driver 160 is not ready to drive the audio amplifier chip 10, and the audio amplifier chip 10 is thereby prevented from being started.

At a time point t3, the comparison result COM_R2 indicates that the input voltage DEL_V not being greater than the threshold voltage TH_V within the time interval $T_1$, the detection result DET_R therefore indicates that the SoC driver 160 is ready to drive the audio amplifier chip 10 (e.g., both the SoC driver 160 and the audio amplifier chip 10 are powered on). As a result, at a time point t4, the current providing circuit 102 may be modified to provide the current $I_{QC}$ for charging the DC blocking capacitor $C_1$, and the detection circuit 104 may start to detect whether the external resistor (e.g., the resistor $R_1$) exists according to the input voltage DEL_V and the threshold voltage TH_V. That is, the detection circuit 104 will wait until the external driver is ready before starting to detect the external resistor. In addition, in response to the input voltage DEL_V being greater than the threshold voltage TH_V at the time point t4, a voltage level of the detection result DET_R may be toggled from a low level to a high level for indicating that the resistor $R_1$ exists.

Figure 5:
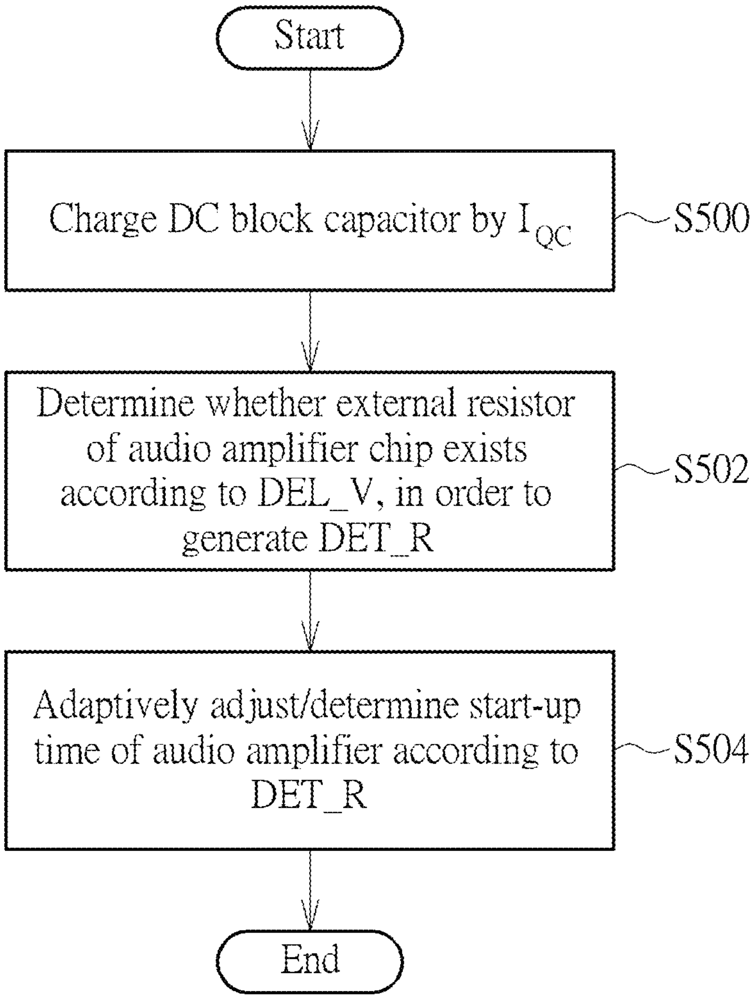
FIG. 5 is a flow chart of a method for adaptively adjusting a start-up time of an audio amplifier according to an embodiment of the present invention.

FIG. 5 is a flow chart of a method for adaptively adjusting a start-up time of the audio amplifier 100 according to an embodiment of the present invention, wherein the audio amplifier 100 is included in the audio amplifier chip 10. Provided that the result is substantially the same, the steps are not required to be executed in the exact order shown in FIG. 5. For example, the method shown in FIG. 5 may be employed by the current providing circuit 102, the detection circuit 104, and the control circuit 106 shown in FIG. 1.

In Step S500, a DC block capacitor is charged by the current $I_{QC}$ provided by the current providing circuit 102, wherein the DC block capacitor is coupled to one of multiple differential input terminals of the audio amplifier 100.

In Step S502, it is determined whether an external resistor of the audio amplifier chip 10 exists according to the input voltage DEL_V from a node, in order to generate the detection result DET_R, wherein the node is located between the one of the multiple differential input terminals of the audio amplifier 100 and the DC blocking capacitor.

In Step S504, a start-up time of the audio amplifier 100 is adaptively adjusted/determined according to the detection result DET_R.

Since a person skilled in the pertinent art can readily understand details of the steps after reading above paragraphs directed to the current providing circuit 102, the detection circuit 104, and the control circuit 106 shown in FIG. 1, further description is omitted here for brevity.

In summary, by the method and an associated audio amplifier chip proposed by the present invention, a start-up time of an audio amplifier can be adaptively adjusted according to different scenarios (e.g., existence of external resistors of the audio amplifier chip). In this way, an optimized balance between the start-up time and the POP problems can be achieved, and the audio amplifier chip of the present invention can be applied to different types of speakers (e.g., speakers with/without the external resistors). In addition, the method and the audio amplifier chip of the present invention can further detect whether an external SoC driver is ready to drive the audio amplifier chip, and the audio amplifier chip is prevented from being started until the external SoC driver is ready. In this way, the potential POP problems may be further avoided.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An audio amplifier chip, comprising:

an audio amplifier, arranged to drive a speaker, wherein the audio amplifier has multiple differential input terminals, and a direct current (DC) blocking capacitor is coupled to one of the multiple differential input terminals;

a current providing circuit, arranged to provide at least one current for charging the DC blocking capacitor;

a detection circuit, coupled to a node located between the one of the multiple differential input terminals and the DC blocking capacitor, and arranged to detect whether an external resistor of the audio amplifier chip exists according to an input voltage from the node, in order to generate a detection result; and a control circuit, arranged to determine a start-up time of the audio amplifier according to the detection result.

2. The audio amplifier chip of claim 1, wherein the detection circuit comprises:

a comparator circuit, arranged to perform a comparison operation upon the input voltage and a threshold voltage, in order to generate a comparison result, wherein the detection result depends on the comparison result.

3. The audio amplifier chip of claim 2, wherein in response to the comparison result indicating that the input voltage is greater than the threshold voltage, the detection result indicates that the external resistor exists.

4. The audio amplifier chip of claim 2, wherein the detection circuit further comprises:

at least one resistor-capacitor (RC) constant circuit, arranged to receive the input voltage, and extract a previous input voltage according to the input voltage for acting as the threshold voltage.

5. The audio amplifier chip of claim 1, wherein the control circuit comprises:

multiple start-up time generating circuits, arranged to generate multiple start-up times; and a multiplexer circuit, arranged to:

receive the multiple start-up times from the multiple start-up time generating circuits;

receive the detection result from the detection circuit as a selection signal; and perform a selection operation upon the multiple start-up times according to the selection signal, in order to generate a selected start-up time for acting as the start-up time of the audio amplifier.

6. The audio amplifier chip of claim 5, wherein the multiple start-up times comprise a first start-up time and a second start-up time, the first start-up time is greater than the second start-up time, and in response to the detection result indicating that the external resistor exists, the multiplexer circuit selects the first start-up time as the selected start-up time.

7. The audio amplifier chip of claim 5, further comprising:

a switching circuit, wherein the switching circuit is coupled between the multiple differential input terminals, and the control circuit is further arranged to generate a switching control signal and an enabling signal according to the selected start-up time for controlling switching of the switching circuit and enabling the current providing circuit, respectively, in order to control the start-up time of the audio amplifier as the selected start-up time.

8. The audio amplifier chip of claim 1, wherein the at least one current comprises a first current and a second current, a current value of the first current is greater than a current value of the second current, and after the DC blocking capacitor is charged by the second current, the detection circuit is further arranged to detect whether an external driver is ready to drive the audio amplifier chip according to the input voltage within a time interval, in order to generate the detection result.

9. The audio amplifier chip of claim 8, wherein the detection circuit comprises:

a comparator circuit, arranged to perform a comparison operation upon the input voltage and a threshold voltage, in order to generate a comparison result, wherein the detection result depends on the comparison result.

10. The audio amplifier chip of claim 9, wherein after the DC blocking capacitor is charged by the second current, in response to the comparison result indicating that the input voltage not being greater than the threshold voltage within the time interval, the detection result indicates that the external driver is ready to drive the audio amplifier chip.

11. The audio amplifier chip of claim 9, wherein only after the detection result indicates that the external driver is ready to drive the audio amplifier chip, the current providing circuit provides the first current for charging the DC blocking capacitor, and the detection circuit starts to detect whether the external resistor exists according to the input voltage.

12. A method for adaptively adjusting a start-up time of an audio amplifier, wherein a speaker is driven by the audio amplifier, the audio amplifier is comprised in an audio amplifier chip, and the method comprises:

charging a direct current (DC) block capacitor by at least one current, wherein the DC block capacitor is coupled to one of multiple differential input terminals of the audio amplifier;

detecting whether an external resistor of the audio amplifier chip exists according to an input voltage from a node, in order to generate a detection result, wherein the node is located between the one of the multiple differential input terminals and the DC blocking capacitor; and determining the start-up time of the audio amplifier according to the detection result.

13. The method of claim 12, wherein the step of detecting whether the external resistor exists according to the input voltage from the node, in order to generate the detection result comprises:

performing a comparison operation upon the input voltage and a threshold voltage, in order to generate a comparison result, wherein the detection result depends on the comparison result.

14. The method of claim 13, wherein in response to the comparison result indicating that the input voltage is greater than the threshold voltage, the detection result indicates that the external resistor exists.

15. The method of claim 13, further comprising:

extract a previous input voltage according to the input voltage for acting as the threshold voltage.

16. The method of claim 12, further comprising:

generating multiple start-up times; and performing a selection operation upon the multiple start-up times according to the detection result, in order to generate a selected start-up time for acting as the start-up time of the audio amplifier.

17. The method of claim 16, wherein the multiple start-up times comprise a first start-up time and a second start-up time, the first start-up time is greater than the second start-up time, and in response to the detection result indicating that the external resistor exists, the first start-up time is selected as the start-up time of the audio amplifier.

18. The method of claim 16, wherein the audio amplifier chip further comprises a switching circuit and a current providing circuit, the switching circuit is coupled between the multiple differential input terminals, the current providing circuit provides the at least one current for charging the DC blocking capacitor, and the method further comprises:

generating a switching control signal and an enabling signal according to the selected start-up time for controlling switching of the switching circuit and enabling the current providing circuit, respectively, in order to control the start-up time of the audio amplifier as the selected start-up time.

19. The method of claim 12, wherein the at least one current comprises a first current and a second current, a current value of the first current is greater than a current value of the second current, and the method further comprises:

after the DC blocking capacitor is charged by the second current, detecting whether an external driver is ready to drive the audio amplifier chip according to the input voltage within a time interval, in order to generate the detection result.

20. The method of claim 19, wherein the step of after the DC blocking capacitor is charged by the second current, detecting whether the external driver is ready to drive the audio amplifier chip according to the input voltage within the time interval, in order to generate the detection result comprises:

performing a comparison operation upon the input voltage and a threshold voltage, in order to generate a comparison result, wherein the detection result depends on the comparison result.

21. The method of claim 20, wherein in response to the comparison result indicating that the input voltage not being greater than the threshold voltage within the time interval, the detection result indicates that the external driver is ready to drive the audio amplifier chip.

22. The method of claim 21, further comprising:

only after the detection result indicates that the external driver is ready to drive the audio amplifier chip, providing the first current for charging the DC blocking capacitor, and starting to detect whether the external resistor exists according to the input voltage.

* * * * *